United States Patent [19]

Lade et al.

[11] Patent Number: 4,571,513
[45] Date of Patent: Feb. 18, 1986

[54] LATERAL BIDIRECTIONAL DUAL NOTCH SHIELDED FET

[75] Inventors: Robert W. Lade, Fort Myers, Fla.; James A. Benjamin, Waukesha; Herman P. Schutten, Milwaukee, both of Wis.

[73] Assignee: Eaton Corporation, Cleveland, Ohio

[21] Appl. No.: 390,478

[22] Filed: Jun. 21, 1982

[51] Int. Cl.[4] .......................................... H03K 17/687
[52] U.S. Cl. ................................... 307/577; 307/584; 357/23.4; 357/23.8; 357/23.14; 357/39; 357/41; 357/43; 357/86
[58] Field of Search ...... 357/73 VD, 23 MG, 23 HN, 357/55, 59, 86, 93, 23.4, 24.8, 24.14, 41, 43

[56] References Cited

U.S. PATENT DOCUMENTS 3,798,514  3/1974  Hayashi et al. ............... 357/23 VD
4,199,774  4/1980  Plummer ........................ 357/23 VD

OTHER PUBLICATIONS

J. Tihanyi, "Funct. Integ. of Power MOS and Bipolar Devices," Proc. 1980 IEEE IEDM, Dec. 1980, pp. 75–78.
"A Parametric Study of Power MOSFET'", C. Hu, IEEE Electron Device Confeence; Paper CH 1461-3/79, 0000-0385.
IEEE Transactions Electron Devices, vol. ED-25; #10; Oct. 1978.
"UMOS Transistors on (110) Silicon", Ammar & Rogers, Transactions IEEE; ED-27; May 1980; pp. 907–914.
"Optimum Doping Profile for Minimum Ohmic Resistance and High Breakdown Voltage", C. Hu; IEEE Transactions Electron Devices; vol. ED-26; 1970; pp. 243–244.
P. Ou-Yang, "Double Ion Implanted V-MOS Tech," IEEE J. of S.-S. CKTS., vol. SC-12, #1, Feb. 1977, pp. 3–10.

Primary Examiner—Joseph E. Clawson, Jr.
Attorney, Agent, or Firm—Andrus, Sceales, Starke & Sawall

[57] ABSTRACT

Lateral FET Structure is disclosed for bidirectional power switching, including AC application. A pair of notches, each with a gate electrode, extend downwardly from a top major surface to separate left and right source regions and left and right channel regions, and direct the drift region current path between the channels around the bottoms of the notches. In the OFF state, each gate electrode shields its respective notch edge drift region portion from the electric field gradient from the other gate electrode, to prevent depletion along the notches and unwanted inducement of conduction channels, thus affording higher OFF state voltage blocking capability. High density, high voltage plural FET structure is disclosed.

7 Claims, 23 Drawing Figures

Fig. 1 VMOS FET PRIOR ART

Fig. 2 DMOS FET PRIOR ART

Fig. 3 VMOS WITH POLY-SI GATE PRIOR ART

Fig. 5 PRIOR ART

Fig. 4 PRIOR ART DMOS WITH POLY-SI GATE (HEX FET)

Fig. 6 PRIOR ART SIPMOS FET

Fig. 11  PRIOR ART LATERAL MOSFET

LATERAL BIDIRECTIONAL DUAL NOTCH SHIELDED FET

TECHNICAL FIELD

The invention relates to power switching semiconductors, and more particularly to power MOSFETs (Metal Oxide Semiconductor Field Effect Transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e. resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $R_{on} = kV_B^{2.6}$ ohm-cm$^2$ where $R_{on}$ is $_{-9}$ the ON state resistance, k is a constant ($3.7 \times 10$), and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ED-26, pages 243-244, 1979.

SUMMARY

The present invention provides lateral power FET structure which is bidirectional, i.e. current can flow in either direction when the device is in the ON state, whereby to afford AC application.

A dual notch gate structure provides inherent shielding to afford increased OFF state voltage blocking capability, including non-floating gate implementations.

First and second spaced notches extend downwardly from a top major surface to separate right and left source regions and right and left channel regions, and direct the drift region current path between the channels around the bottoms of the notches. Each notch has a gate electrode for controlling bidirectional conduction.

The right gate electrode in the right notch is insulated between the left gate electrode in the left notch and the portion of the drift region along the right edge of the right notch. In the OFF state, the right gate electrode shields the right notch edge drift region portion from electric field gradients from the left gate electrode. This prevents the left gate electrode from attracting given polarity carriers in the drift region towards the right edge of the right notch, which in turn prevents unwanted notch edge drift region depletion and inducement of conduction channels. Likewise in the other half cycle of an AC source for example, the left gate electrode shields the portion of the drift region along the left edge of the left notch from electric field gradients from the right gate electrode.

In a desirable aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

Present Invention

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

Figure 1:
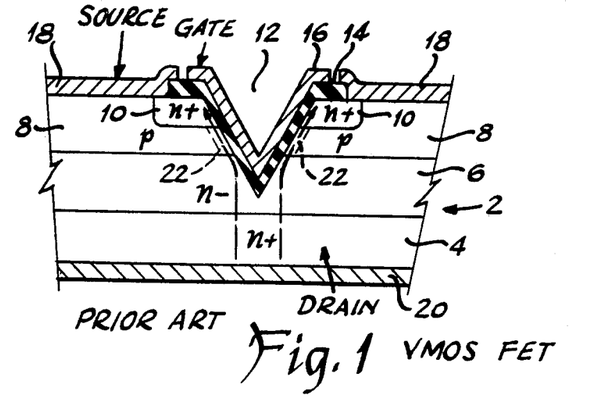
FIG. 1 is a schematic cross-sectional view of a VMOS FET.

A cross-sectional view of a typical non-planar vertical device is illustrated in FIG. 1, showing a VMOS structure 2. The starting material is an n+ silicon wafer 4 with an n− epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs", C. Hu, IEEE Electron Device Conference, paper CH1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907-914.

Figure 2:
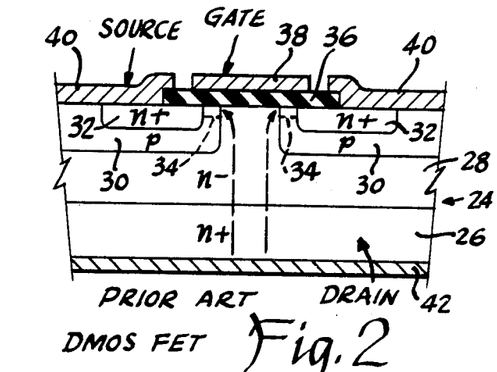
FIG. 2 is a schematic cross-sectional view of a DMOS FET.

An alternative configuration is the DMOS (double diffused metal oxide semiconductor) FET 24, FIG. 2. N+ starting material 26 has an n− epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 85% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$, such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

Figure 3:
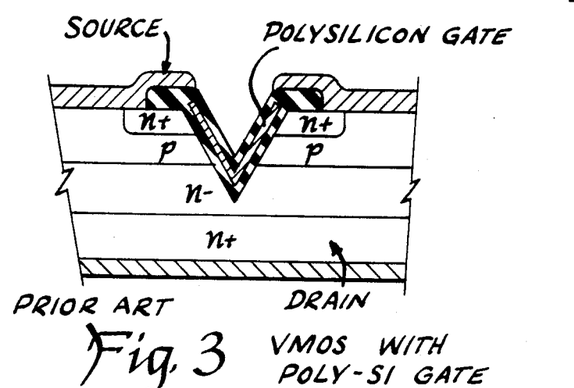
FIG. 3 is a schematic cross-sectional view of a VMOS FET with a polysilicon gate.
Figure 4:
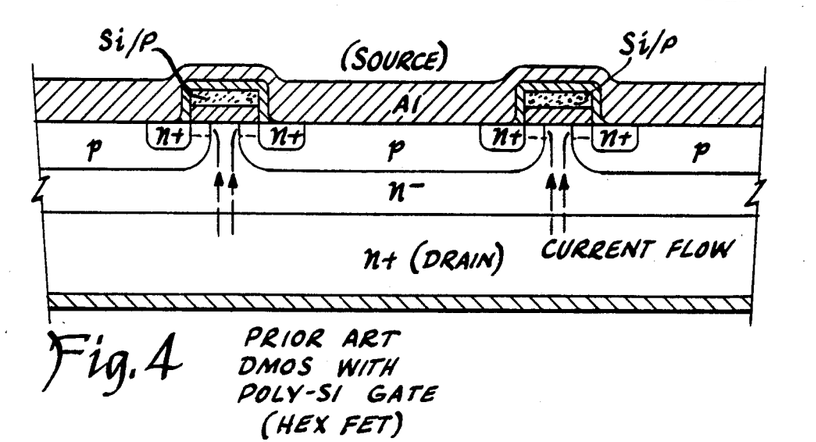
FIG. 4 is a schematic cross-sectional view of a DMOS FET with a polysilicon gate (HEXFET).
Figure 5:
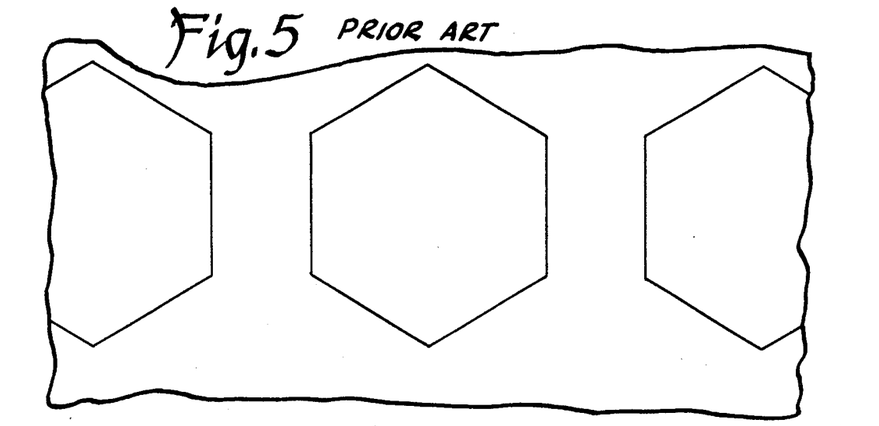
FIG. 5 shows a top view of the structure of FIG. 4, illustrating the HEX outline.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Figure 6:
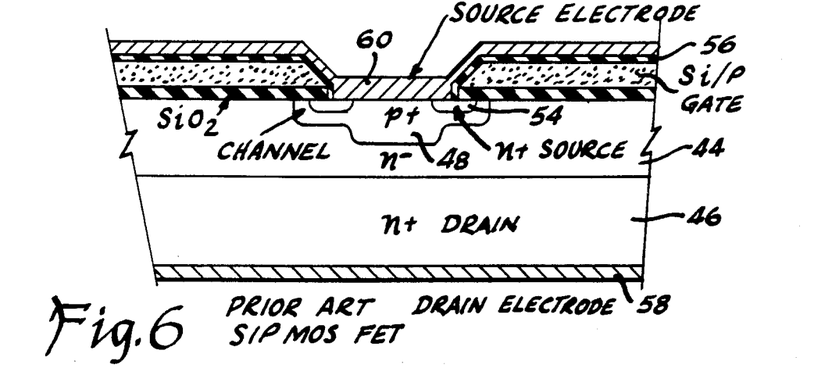
FIG. 6 is a schematic cross-sectional view of a SIPMOS FET.
Figure 7:
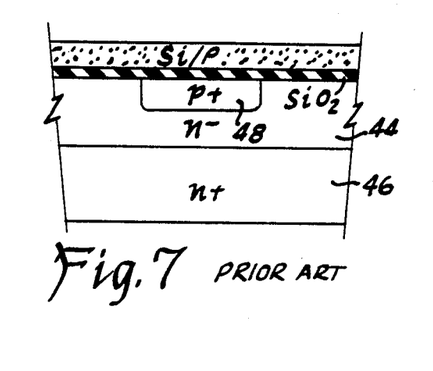
FIGS. 7 through 10 schematically illustrate the process steps yielding the structure of FIG. 6.
Figure 8:
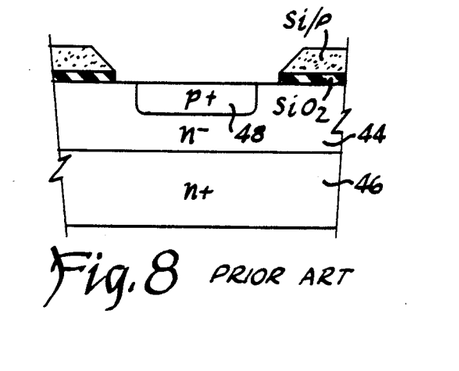

Another vertical planar unit is the SIPMOS structure shown in FIG. 6. An n− epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrochloric acid. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

Figure 9:
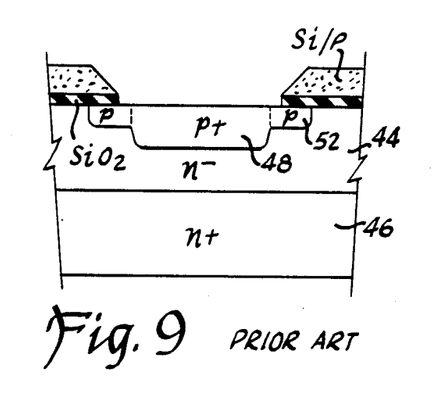
Figure 10:
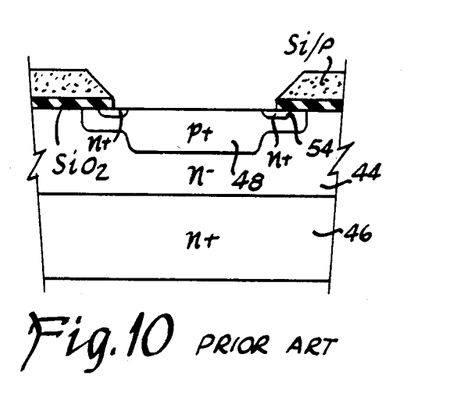

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

Figure 11:
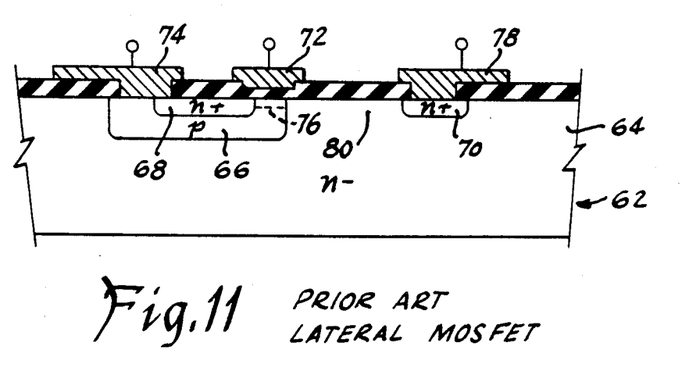
FIG. 11 is a schematic cross-sectional view of a lateral MOSFET.

As with the previously mentioned vertical MOSFETs, the lateral MOSFET 62 of FIG. 11 is unidirectional.

Device 62 is subject to the above noted tradeoff between lateral length of the drift region 80 (i.e. the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabilities of n region 64 and p region 66. Thus a new geometry and perhaps technology would be required.

Though not limited thereto, the present invention evolved from efforts to provide bidirectionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

Figure 12:
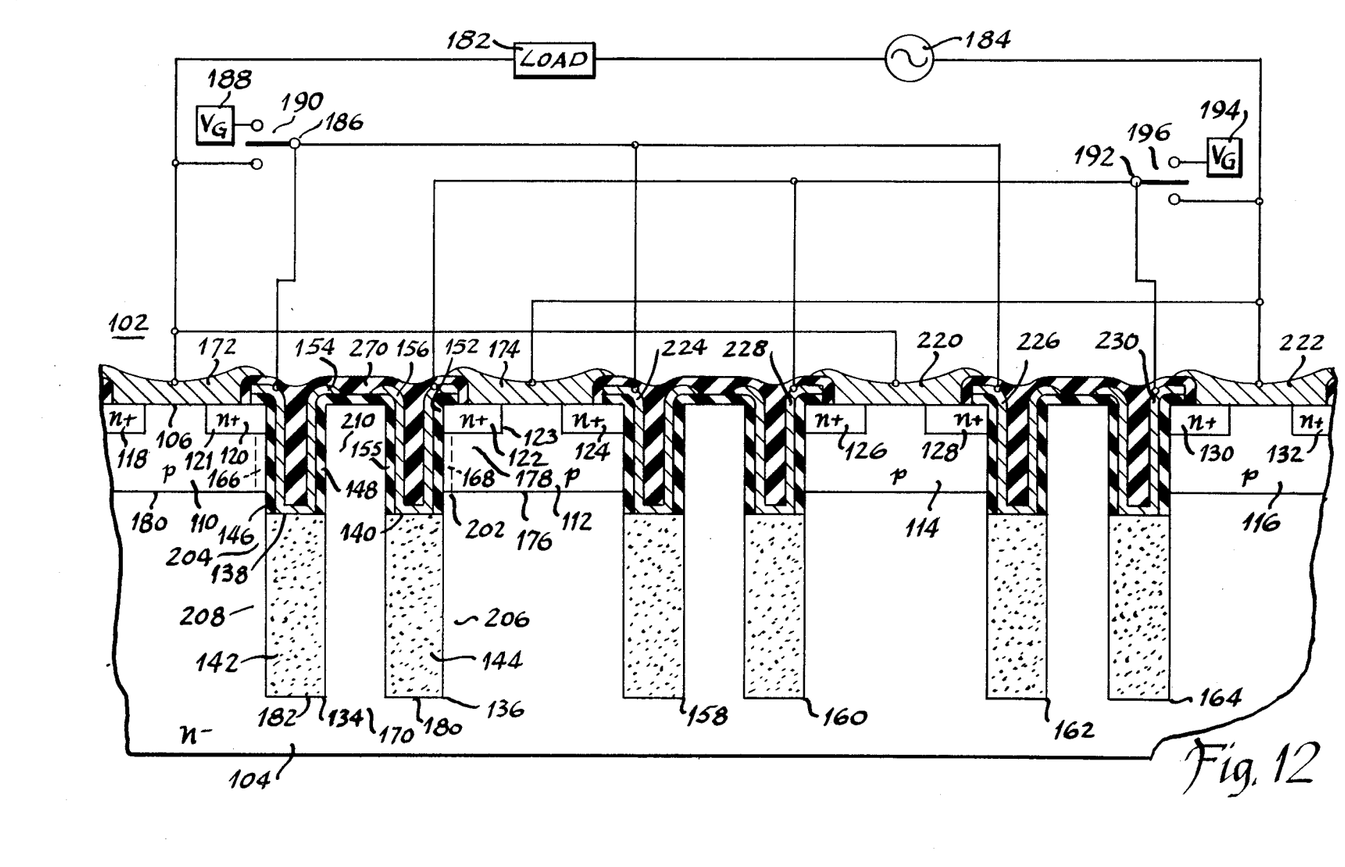
FIG. 12 is a schematic sectional view illustrating lateral bidirectional FET structure in accordance with the invention.
Figure 13:
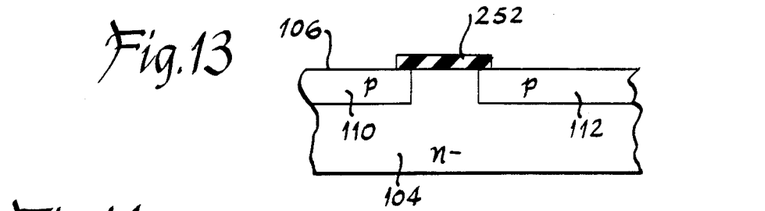
FIGS. 13 through 18 show the processing of the structure of FIG. 12.
Figure 14:
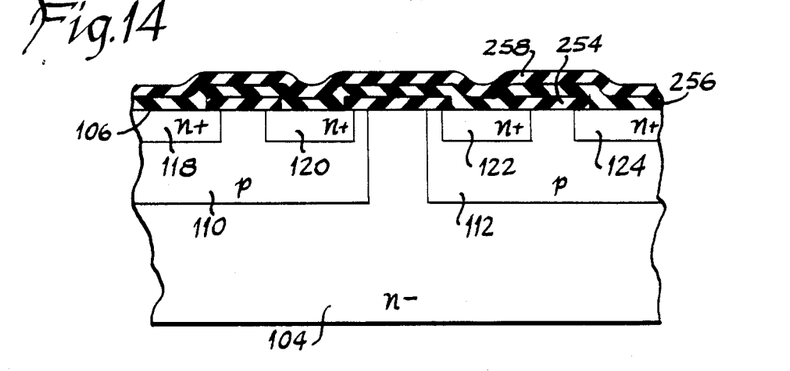
Figure 15:
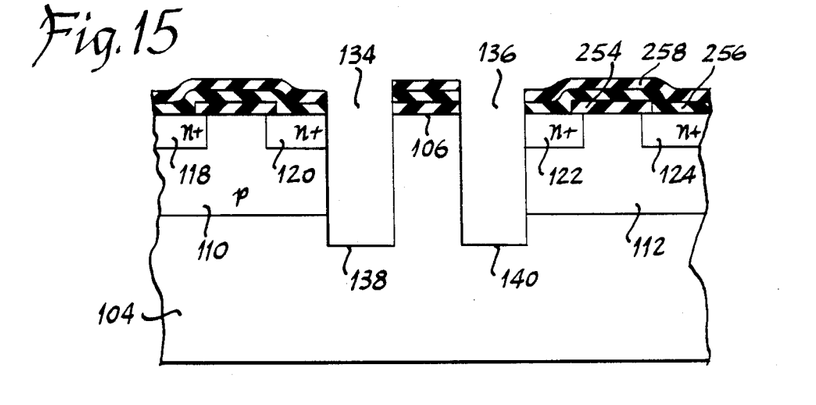

FIG. 12 schematically shows lateral bidirectional power FET structure constructed in accordance with the invention. FET structure 102 includes a substrate 104 of one conductivity type having a top major surface 106. In preferred form, substrate 104 includes an n− layer. A p layer including regions 110, 112, 114, 116 and so on, is diffused into or epitaxially grown on the substrate to a predetermined depth forming a first top layer. A second top layer is formed in the first top layer to a given depth, yielding n+ regions 118, 120, 122, 124, 126, 128, 130, 132, and so on, to be more fully described hereinafter.

First and second spaced notches 134 and 136 are formed in the substrate from top major surface 106. These notches may be anisotropically etched, as known in the art: C. Hu, "A Parametric Study of Power MOSFETs", IEEE Electron Device Conference, paper CH 14613/79, 0000–0385; IEEE Transactions Electron Devices, Volume ED-25, #10, October 1978; and Ammar and Rogers, "UMOS Transistors on Silicon", Transactions IEEE, ED-27, pages 907–914, May 1980. Alternatively, the notches may be formed by a porous silicon region in accordance with the known anodization technique of passing a fixed current through the localized region in the presence of concentrated hydrogen floride to create a structural change in the silicon which remains single crystalline with the substrate but becomes porous. In the case of anodization, the notches are initially etched down to respective levels 138 and 140, followed by the anodization, after which the substrate is subjected to an oxidizing atmosphere. Oxygen enters the pores and rapidly oxidizes regions 142 and 144, which regions remain single crystalline with substrate 104 but are substantially nonconductive. During oxidation, oxide layers 146 and 148 are formed along the vertical walls on the left notch 134 above level 138, and oxide layers 150 and 152 are formed along the vertical walls of right notch 136. Each notch is then filled with conductive material, for example titanium disilicide, tantalum disilicide, or tungsten disilicide, providing gate electrodes 154 and 156. A plurality of other notch pairs 158 and 160, 162 and 164, and so on, are likewise formed.

Notch pair 134 and 136 extends from top major surface 106 downwardly through the second and first top layers into substrate 104. These notches separate the second top layer into first and second laterally spaced source regions 120 and 122 and extend therebetween. The notches separate the first top layer into first and second spaced channel regions 166 and 168 and extend therebetween. The substrate region 104 around the bottom notches forms a drift region 170 in the substrate.

Main electrode metalization 172 is deposited on top major surface 106 to ohmically contact source region 120 and the second top layer region 110 common to channel region 166. Electrode 172 also ohmically contacts region 118. Another main electrode metalization 174 is deposited on top major surface 106 to ohmically contact source region 122 and the first top layer region 112 common to channel region 168. Electrode 174 also ohmically contacts region 124.

Upon application of a positive voltage to left gate electrode 154 with respect to left main electrode 172, electrons in p region 110 are attracted to channel region 166 to invert the conductivity type therein to n type and hence allow electron flow from n+ source region 120 through left channel 166 into drift region 170 in substrate 104. If main electrode 174 is positive with respect to main electrode 172, current may then flow from right p layer region 112 momentarily across a forward biased pn junction 176 into drift region 170, then through channel 166 to source region 120 and electrode 172. As soon as current starts to flow through the FET, the voltage across main electrodes 174 and 172 drops, which in turn reduces the potential in various regions of the FET, including portion 178 of p layer 112 adjacent the right FET channel 168. This falling potential in area 178 causes migration of carrier electrons into channel region 168, i.e. portion 178 becomes negative relative to right gate electrode 156 at a given gate potential, whereby positive gate 156 attracts electrons into channel region 168 to invert the conductivity type thereof to n type, and hence render channel 168 conductive. Forward biased pn junction 176 thus conducts only momentarily until the second channel 168 turns ON.

The main current path through the FET is from main electrode 174 through right source region 122, downwardly through vertical channel region 168 along the right distal side of right notch 136, then further downwardly into drift region 170 along the right side of right notch 136, then around the bottoms 180 and 182 of the notches, then upwardly along the left distal side of left notch 134 in drift region 170, then upwardly through vertical channel region 166 along the left side of left notch 134, then through left source region 120 to main electrode 172.

The structure is bilateral, and thus current may also flow from main electrode 172 to main electrode 174 when gate 156 is positive with respect to electrode 174. Electrons in p layer 112 are attracted into channel region 168 by gate 156 to thus invert channel region 168 to n type and hence allow electron flow from right n+ source region 122 through channel 168 into drift region 170 in substrate 104. If main electrode 172 is positive with respect to main electrode 174, current then flows from left p layer 110 momentarily across forward biased pn junction 180 until channel 166 turns ON. The main current path is from main electrode 172 through left source region 120, through left channel 166, through drift region 170 around the bottoms of the notches, through right channel 168, through right source region 122 to main electrode 174. Main electrode 174 thus serves as an electron current source when a negative voltage is applied thereto relative to the voltage on main electrode 174, and serves as an anode when a positive voltage is applied thereto relative to the voltage on main electrode 172.

The application of electrical gate potential to gate electrodes 154 and 156 enables them to produce electric fields of sufficient intensity to invert the conductivity type in the respective first and second channel regions 166 and 168. Upon application of voltage of either polarity to the first and second source regions 120 and 122, the electric current can flow in a respective corresponding direction between them, under control of the electrical gate potential of the gate electrode means 154 and 156. The current flow between spaced apart regions 120 and 122 is controllable by controlling the electric fields in channel regions 166 and 168, which in turn are controllable by controlling the electric potential on the gate electrode means 154 and 156.

In the absence of gate potential on gate electrodes 154 and 156, channel regions 166 and 168 are p type, and the device is in a blocking OFF state. Currrent from main electrode 172 to main electrode 174 is blocked by junction 176. The current flow in the other direction from main electrode 174 to main electrode 172 is blocked by junction 180.

Bidirectional FET 102 may be used to control AC power, as schematically shown by load 182 and a source of AC power 184 connected across main electrodes 172 and 174. Gate electrode 154 is connected by a gate terminal 186 to a source of gate potential 188 through switch means 190. Gate electrode 156 is connected by a gate terminal 192 to a source of gate potential 194 through switch means 196. In the ON state of FET 102, switches 190 and 196 are in an upward position such that a given polarity gate potential is applied to each of gate electrodes 154 and 156, which gate potential is positive with respect to the lowest potential level from source 184 during either half cycle.

When main electrode 174 is positive with respect to main electrode 172, as driven by AC source 184, gate electrode 154 is positive with respect to region 110 and electrode 172. Channel 166 is thus inverted to n type and conduction occurs, i.e. current flows from positive main electrode 174 through source region 122, through channel 168, through drift region 170 around the bottom of the notches, through channel 166, through source region 120 to negative main electrode 172 and through load 182.

In the other half cycle of the AC source 184, main electrode 172 is positive with respect to main electrode 174, and gate electrode 156 is positive with respect to region 112 connected to negative main electrode 174. Conduction is thus enabled through channel 168, and current flows from positive main electrode 172 through source 120, through channel 166, through drift region 170 in substrate 104 around the bottom of the notches, through channel 168, to source 122 and main electrode 174.

A particularly desirable aspect of FET structure 102 is its high voltage blocking capability in the OFF state, including non-floating gate implementations. In the OFF state, switches 190 and 196 are in the downward position such that gate electrode 154 is connected to the same potential level as main electrode 172, and gate electrode 156 is connected to the same potential level as main electrode 174.

During the first half cycle of the AC line during the OFF state of the FET, voltage rises positively at right main electrode 174 relative to left main electrode 172. The potential in right p region 112 thus rises positively, and since there is only a single forward biased drop across junction 176 to substrate 104, the potential in substrate 104 likewise rises positively. The potential in substrate area 202 along the right side of right notch 136 below right channel 168 thus also rises positively. The left gate electrode 154 is negative since it is tied through terminal 186 and switch 190 to the left main electrode 172. This relatively negative gate electrode 154 thus establishes an electric field gradient between itself and the relatively positive substrate 104. This relatively negative gate electrode 154 and the electric field gradient causes attraction of carrier holes in substrate 104 toward the edges of left notch 134 proximate gate electrode 154. The potential at region 204 in the substrate is low, but the potential in the substrate increases as one moves downwardly along the left edge of left notch 134 farther away from negative gate electrode 154. There is thus established an electric field gradient between the distal edges of the notches, i.e. the potential in substrate drift region portion 206 along the right edge of right notch 136 is positive relative to the potential in substrate drift region portion 208 along the left edge of left notch 134. The potential of the substrate region 210 between the notches is likewise positive relative to gate electrode 154.

As the potential on main electrode 174 rises higher relative to main electrode 172, the electric field gradient becomes stronger. More holes in substrate 104 may thus be attracted into region 202 along the right side of right notch 136 below right channel 168, due to the attraction from negative gate electrode 154 and the electric field gradient created. Holes may thus migrate into region 202, causing depletion of majority carrier electrons out of this region. If the concentration of minority carrier holes along region 202 becomes great enough, the conductivity type of this notch edge drift region may become inverted to p type. If a p type channel is formed along region 202, then a conductive p channel is formed in the drift region around the notches, and the device loses its OFF state voltage blocking capability. That is, current can flow from positive main electrode 174 through p region 112, through the electric field gradient induced p channel along the edges of the notches, through p region 110 to negative main electrode 172. The induced conductive channel depletion region extends along the right side of right notch 136 then around the bottoms 180 and 182 of the notches, then along the left side of left notch 134. This limits the OFF state voltage blocking capability of the device.

The structure in FIG. 12 enhances OFF state voltage blocking capability in a number of ways. The right gate electrode 156 shields the right notch edge drift region portion 202 from the electric field gradient from left gate electrode 154, thus preventing depletion and unwanted inducement of conduction channels in the drift region 170 during the OFF state of the FET, thus affording high voltage blocking capability. Right gate electrode 156 is at the same potential as main electrode 174 when switch 196 is in the downward position. Right gate electrode 156 is between left gate electrode 154 and the right notch edge drift region portion 202. Since the right gate electrode 156 is at substantially the same potential level as right notch edge drift region portion 202, the latter region is shielded from the effects of relatively negative left gate electrode 154 and the electric field gradient thereto. The structure is symmetric, and in the other half cycle of the AC source with left main electrode 172 rising positively relative to right main electrode 174, left gate electrode 154 is insulated between the relatively negative right gate electrode 156 and the left notch edge drift region portion 204 and shields the latter from electric field gradient induced depletion.

Higher OFF state voltage blocking capability is further afforded by the increased drift region current path length. The current path between the main electrodes 172 and 174 extends from each source region 120 and 122 downwardly through the channel regions 166 and 168 and downwardly and around the bottoms 180 and 182 of the notches. This increases the drift region current path length and affords higher OFF state voltage blocking capability without increasing the lateral dimension along the top major surface 106, whereby to afford high density, high voltage bidirectional FET structure.

Higher OFF state voltage blocking capability is yet further afforded by the preferred gate and substrate structure. It is preferred that gate electrodes 154 and 156 do not extend too far down into the substrate drift region. This further prevents unwanted inducement of conduction channels in the OFF state. The spacing of gate electrode 154 from the edges of notch 134, particularly the bottom edge 182 of the notch, substantially diminishes the attractive force on carrier holes in substrate 104 toward the edges of notch 134, particularly around the bottom end 182. This enables higher OFF state voltage blocking capability, even in non-floating gate implementations.

As seen in FIG. 12, a plurality of FETs are afforded in the integrated structure. Main electrode metalizations 220, 222, and so on, are provided comparably to that described, and connected in series in the AC load line, or in parallel as shown in FIG. 12. Left gate electrodes 154, 224, 226, and so on, are connected in parallel to gate terminal 186. Right gate electrodes 156, 228, 230, and so on, are connected in parallel to gate terminal 192. Main electrode 174 provides the source electrode for the FET to the left around notch pair 134 and 136, and also provides the source electrode for the FET to the right around notch pair 158 and 160. Main electrode 220 provides the drain electrode for the FET around notch pair 158 and 160, and also provides the drain electrode for the FET around notch pair 162 and 164. In the other half cycle of AC source 184, the roles of electrodes 174 and 220 are reversed, i.e. electrode 174 is the drain for its left and right FETs around respective notch pairs 134 and 136, and 158 and 160; and electrode 220 is the source for its left and right FETs around respective notch pairs 158 and 160, and 162 and 164. Alternate electrodes 172, 220, and so on, are thus connected to one side of the AC source, and the other alternate electrodes 174, 222, and so on, are connected to the other side of the AC source.

There is thus shown a lateral bidirectional dual notch power FET, including: a first source region 120 of one conductivity type; a first channel region 166 of opposite conductivity type forming a junction 121 with first source region 120; a drift region 170 of the one conductivity type forming another junction 180 with the first channel region 166; a second channel region 168 of the opposite conductivity type forming a junction 176 with drift region 170; a second source region 122 of the one conductivity type forming a junction 123 with second channel region 168; first and second spaced notches 134 and 136 extending between the first and second source regions 120 and 122 and the first and second channel regions 166 and 168, and extending into drift region 170 in substrate 104; first insulated gate means 154 in the first notch 134 proximate first channel region 166 and adapted for application of electrical potential for producing electric fields of sufficient intensity to invert the conductivity type in first channel region 166; second insulated gate means 156 in second notch 136 proximate the second channel region 168 and adapted for application of electrical potential for producing electric fields of sufficient intensity to invert the conductivity type in the second channel region 168; whereby upon application of voltage of either polarity to the first and second source regions 120 and 122, the electric current can flow in a respective corresponding direction between them, under control of the electrical potential of the gate means, the conductive current path through drift region 170 traversing along the distal sides of notches 134 and 136 and around the ends 180 and 182 of the notches, the FET having an OFF state with each gate electrode 154 and 156 referenceable to the same potential level as the respective main electrode 172 and 174, each gate electrode shielding its respective notch edge drift region portion from electric field gradients from the other gate electrode, for preventing depletion and unwanted inducement of conduction channel in the drift region during the OFF state.

FIGS. 13 through 18 show the preferred processing of the structure of FIG. 12, and like reference numerals are used were appropriate to facilitate clarity. Starting with a lightly doped n— substrate 104, for example having a donor density of about $5 \times 10^{14}$ donor atoms per cubic centimeter, a plurality of p type regions 110, 112, and so on, are diffused or otherwise formed in the substrate from top major surface 106 through an appropriate mask and oxide pattern 252. The p layer regions are provided by boron at a density of about $1 \times 10^{18}$ donor atoms per cubic centimeter, to a depth of about 3 microns below top major surface 106. A plurality of n+ type regions, for example provided by arsenic, are then diffused, or ion implanted and then annealed, through an appropriate mask and oxide pattern 254, to provide n+ source regions 118, 120, 122, 124, and so on, FIG. 14. A layer of silicon dioxide 256 is then grown on the top surface, followed by deposition of a silicon nitrite layer 258 to a thickness of about 4 microns, to provide a high quality insulating material and a mask definition material. Notches 134 and 136 are then plasma etched from top major surface 106 down to levels 138 and 140 about 4 microns below top major surface 106, FIG. 15.

Figure 16:
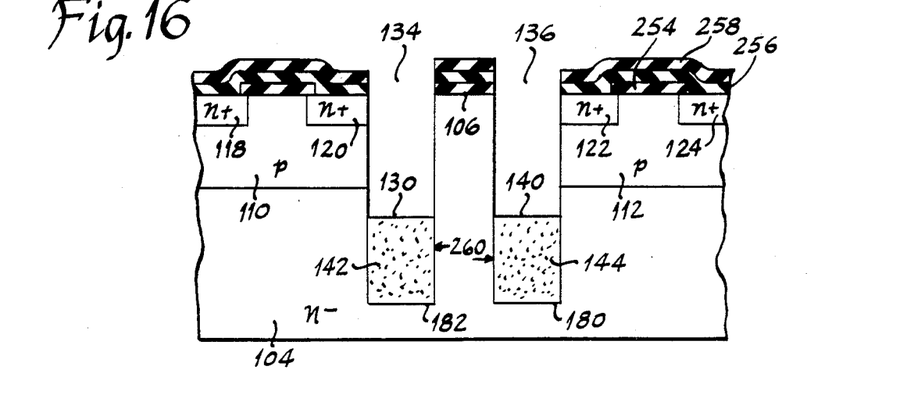

Porous silicon regions 142 and 144, FIG. 16, are then formed by anodization in the presence of hydrogen floride as above. Contacts are placed on the top and bottom surfaces, and since silicon nitrite layer 258 is an insulator, current will only pass through the notch holes 134 and 136 to thus provide selective anodization through vertical regions 142 and 144. A structural change is created in the silicon which remains single crystalline with substrate 104 but becomes porous. The depth of porous silicon regions 142 and 144 at bottom edges 182 and 180 is about 15 microns below top major surface 106. The width of each notch 134 and 136 is about 5 microns, and the spacing 260 between the notches is also about 5 microns. The silicon nitrate layer is removed by etching and the substrate is subjected to an oxidizing atmosphere such that the oxygen enters the pores in porous regions 142 and 144 and rapidly oxidizes these regions, whereby regions 142 and 144 are still single crystalline with substrate 104 but substantially nonconductive.

Figure 17:
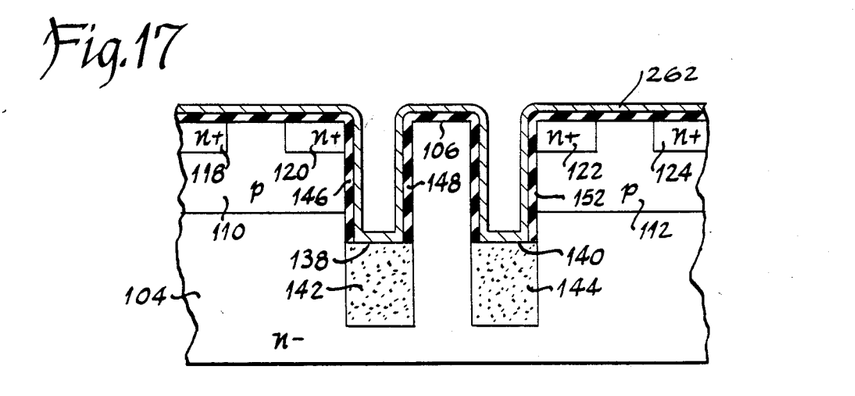
Figure 18:
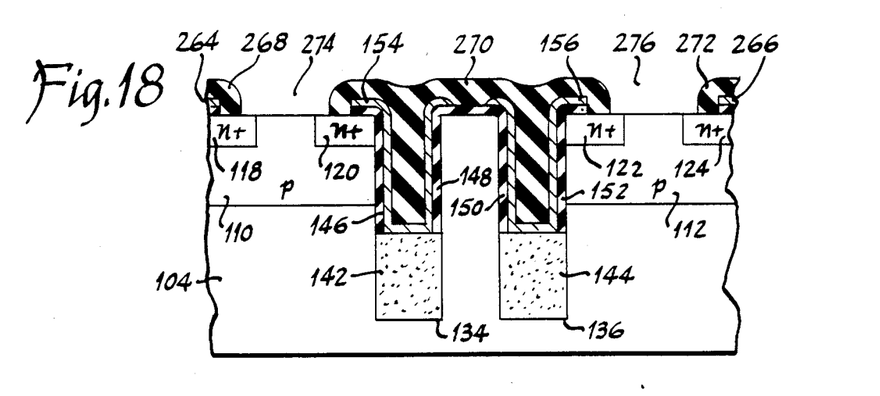

After the oxidation, silicon dioxide layers 146, 148, 150, and 152, FIG. 17, remain along the vertical walls of the notch holes. Gate metalization is then deposited over the top surface, for example by a sputtering process using titanium disilicide, tantalum disilicide, or tungsten disilicide, yielding gate layer 262. Layer 262 is then masked and etched, followed by low temperature silicon dioxide chemical vapor deposition, FIG. 18, providing gate electrodes 264, 154, 156, 266, and so on, insulating layers 268, 270, 272, and so on, and open areas 274, 276, and so on. Aluminum metalization is then sputtered or deposited in the open areas 274, 276 and so on, resulting in main electrodes 172, 174, and so on, FIG. 12.

Figure 19:
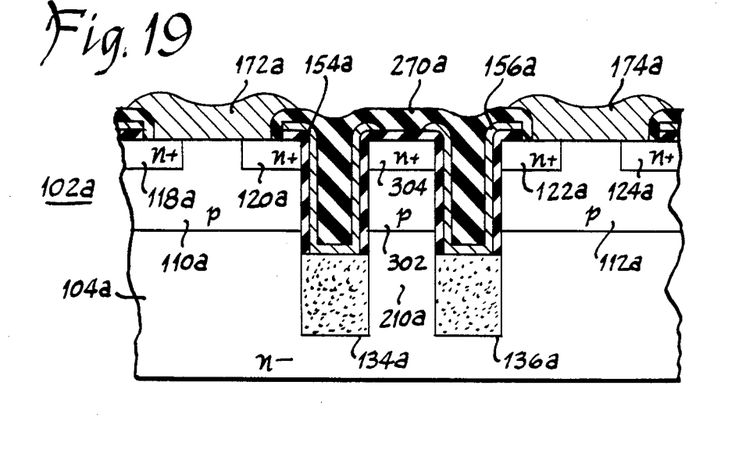
FIG. 19 is a schematic sectional view illustrating alternative FET structure.

FIG. 19 shows alternative FET structure in accordance with the invention, and like reference numerals with the postscript letter "a" are used where appropriate to facilitate clarity. Central substrate region 210a does not extend all the way up between the notches to top major surface 106a. There is instead a p type region 302 and an n+ region 304 above the central partial upward extension 210a of the substrate. FET 102a of FIG. 19 operates like FET 102 of FIG. 12, including the OFF state voltage blocking characteristics.

Figure 20:
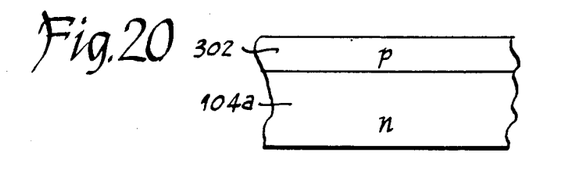
FIGS. 20 through 22 show the processing of the structure of FIG. 19.
Figure 21:
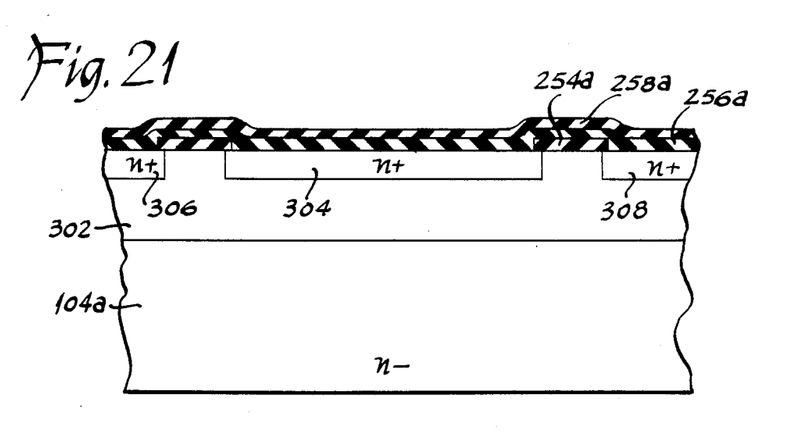
Figure 22:
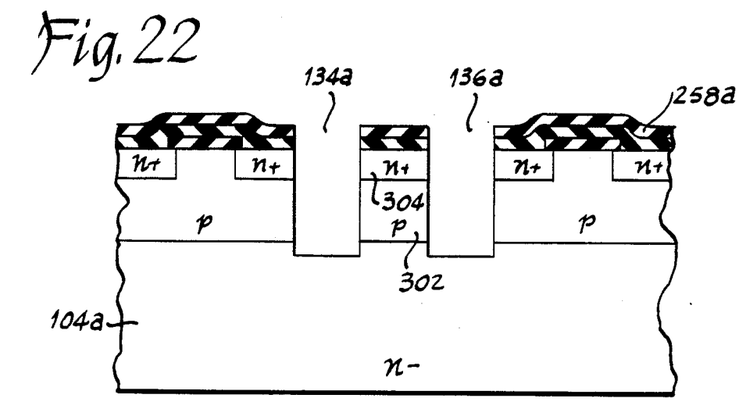

FIGS. 20 through 22 show the processing of the structure of FIG. 19. Starting with n− substrate 104a, FIG. 20, a p type epitaxial layer 302 is grown to a depth of about 3 microns. n+ regions 306, 304, 308 and so on, are provided by diffusion, or ion implantation and annealing, FIG. 21. These n+ regions are laterally longer than the n+ regions of FIG. 14. A layer of silicon nitrate 258a is applied as before, followed by plasma etching, FIG. 22, of a pair of notches 134a and 136a through n+ region 304 and through p region 302 into substrate 104a. The other n+ regions 306, 308, and so on, likewise have a pair of notches plasma etched therethrough to substrate 104a. The remaining processing is comparable to that described in connection with FIGS. 16 through 18.

Figure 23:
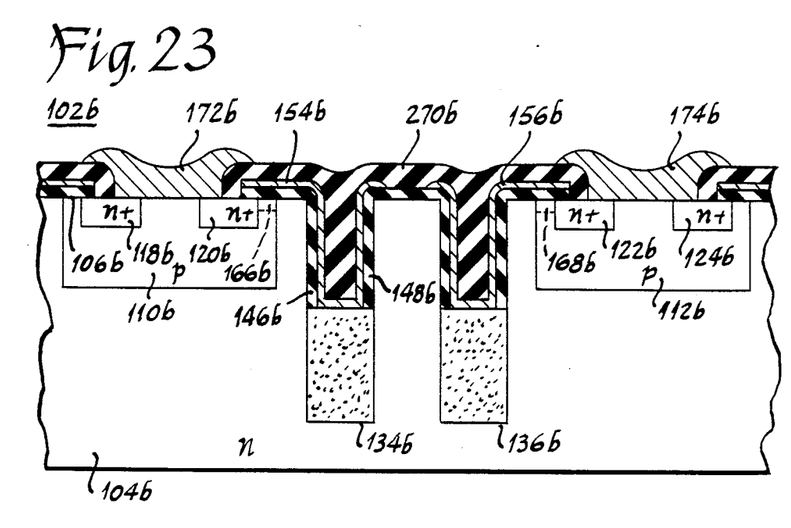
FIG. 23 is a schematic sectional view illustrating further alternative FET structure.

FIG. 23 shows a further alternative structure to FIG. 12, and like reference numerals with the postscript letter "b" are used were appropriate to facilitate clarity. This structure uses lateral channels 166b and 168b. Operation is like that described for FIG. 12, including OFF state voltage blocking capability.

It is recognized that various modifications are possible within the scope of the appended claims.

We claim:

1. A bidirectional FET, comprising in a semiconductor substrate:
   a first source region of one conductivity type semiconductor material;
   a first channel region of opposite conductivity type semiconductor material forming a junction with said first source region;
   a single drift region of one conductivity type semiconductor material forming another junction with said first channel region;
   a second channel region of said opposite conductivity type semiconductor material forming a junction with said drift region;
   a second source region of said one conductivity type semiconductor material forming a junction with said second channel region;
   first and second spaced notches extending between said first and second source regions and said first and second channel regions;
   first insulated gate means in said first notch and including a portion proximate said first channel region and adapted for application of an electrical potential for producing electric fields of sufficient intensity to invert the conductivity type in said first channel region;
   second insulated gate means in said second notch and including a portion proximate said second channel region and adapted for application of an electrical potential for producing electric fields of sufficient intensity to invert the conductivity type in said second channel region;
   said single drift region forming first and second PN junctions with respective said first and second channel regions, said first and second source regions forming third and fourth PN junctions with respective said first and second channel regions;
   a first main electrode contacting said first source region and said first channel region;
   a second main electrode contacting said second source region and said second channel region;
   a source of alternating voltage impressed across said first and second main electrodes such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reverse biased junction;
   a first gating voltage source connected to said first gate means in said second half cycle of said alternating voltage to create a first inversion channel region between said single drift region and said first source region to short the otherwise blocking reverse biased said first PN junction during said second half cycle of said alternating voltage such that current flows through said FET from said second main electrode to said first main electrode during said second half cycle of said alternating voltage;
   a second gating voltage source connected to said second gate means in said first half cycle of said alternating voltage to create a second inversion channel region between said single drift region and said second source region to short the otherwise blocking reverse biased said second PN junction during said first half cycle of said alternating voltage such that current flows through said FET from said first main electrode to said second main electrode during said first half cycle of said alternating voltage;
   said FET having an OFF state in the absence of said gating electrical potential from said first and second gating voltage sources, said single drift region supporting OFF state blocking voltage in both directions, and wherein said first and second gate means are at non-common potentials in said OFF state.

2. The invention according to claim 1 wherein said second gate means is insulated between said first gate means and the opposite side edge of said second notch and comprising means connecting said second gate means to said second main electrode during said second half cycle of said alternating voltage such that said second notch edge drift region portion is shielded from said first gate means by said second gate means therebetween referenced to said second main electrode to prevent electric field gradient induced depletion in said second notch edge drift region portion and to shield the latter and prevent unwanted inducement of conduction channels in said drift region during said OFF state, and wherein said first gate means is insulated between said second gate means and the opposite side edge of said first notch and comprising means connecting said first gate means to said first main electrode during said first half cycle of said alternating voltage such that said first notch edge drift region portion is shielded from said second gate means by said first gate means therebetween referenced to said first main electrode to prevent electric field gradient induced depletion in said first notch edge drift region portion and to shield the latter and prevent unwanted inducement of conduction channels in said drift region during said OFF state.

3. The invention according to claim 2 wherein said channel regions are laterally spaced by said notches, and said notches extend vertically downwardly from a top major surface of said FET, said channel regions extending generally vertically along the distal sides of said notches, said drift region being below said channel regions, two junctions being formed on each of the opposing distal sides of said notches, a first distal side having said junction between said first source region and said first channel region and said junction between said first channel region and said drift region, the other distal side having said junction between said second source region and said second channel region and said junction between said second channel region and said drift region, wherein said notches extend downwardly into said drift region a substantial distance below said first and second gate means to substantially diminish attraction of carriers by said gate means from said drift region toward the edges of said notches, to further prevent unwanted inducement of conduction channels in said OFF state and afford higher OFF state voltage blocking capability.

4. The invention according to claim 3 wherein said source regions are laterally spaced along said top major surface by said notches therebetween, said source regions being above respective said channel regions.

5. A bidirectional FET, comprising:
   a first source region of one conductivity type semiconductor material;
   a first channel region of opposite conductivity type semiconductor material forming a junction with said first source region;
   a single drift region of one conductivity type semiconductor material forming another junction with said first channel region;
   a second channel region of said opposite conductivity type semiconductor material forming a junction with said drift region;
   a second source region of said one conductivity type semiconductor material forming a junction with said second channel region;
   first and second spaced notches extending between said first and second source regions and said first and second channel regions;
   first insulated gate means in said first notch and including a portion proximate said first channel region and adapted for application of an electrical potential for producing electric fields of sufficient intensity to invert the conductivity type in said first channel region;
   second insulated gate means in said second notch and including a portion proximate said second channel region and adapted for application of an electrical potential for producing electric fields of sufficient intensity to invert the conductivity type in said second channel region;
   whereby upon application of voltage of either polarity to said first and second source regions, electric current can flow in a respective corresponding direction between them, under control of said electrical potential of said gate means, the conductive current path through said drift region traversing along the distal sides of said notches and around the ends of said notches, said single drift region around said notches supporting OFF state blocking voltage in both directions;
   wherein said FET has an OFF state in the absence of said electric gate potential, and wherein said second gate means is insulated between said first gate means and the opposite side edge of said second notch for preventing electric field gradient induced depletion in said second notch edge drift region portion whereby to shield the latter and prevent unwanted inducement of conduction channels in said drift region during said OFF state, and wherein said first gate means is insulated between said second gate means and the opposite side edge of said first notch for preventing electric field gradient induced depletion in said first notch edge drift region portion whereby to shield the latter and prevent unwanted inducement of conduction channels in said drift region during said OFF state;
   wherein said channel regions are laterally spaced by said notches, and said notches extend vertically downwardly from a top major surface of said FET, said channel regions extending generally vertically along the distal sides of said notches, said drift region being below said channel regions, two junctions being formed on each of the opposing distal sides of said notches, a first distal side having said junction between said first source region and said first channel region and said junction between said first channel region and said drift region, the other distal side having said junction between said second source region and said second channel region and said junction between said second channel region and said drift region;
   wherein said source regions are laterally spaced along said top major surface by said notches therebetween, said source regions being above respective said channel regions;
   and comprising a pair of main electrodes each connected to a respective said source region, and wherein said first insulated gate means comprises insulation layer means extending along the inner surface of said first notch, and first gate electrode means disposed in said first notch along said insulation layer means such that said first gate electrode means extends in close proximity along and insulated from said vertical first channel region, and wherein said second insulated gate means comprises insulation layer means extending along the inner surface of said second notch, and second gate electrode means disposed in said second notch along said insulation layer means such that said second gate electrode means extends in close proximity along and insulated from said vertical second channel region;
   wherein during said OFF state, the junction between said drift region and one of said channel regions blocks current flow toward one of said main electrodes, and the junction between said drift region and the other of said channel regions blocks current flow toward the other of said main electrodes;
   wherein the drift region current path between said main electrodes extends from said source regions downwardly through said channel regions and downwardly and around the bottom of said notches so as to increase the drift region current path length and afford higher OFF state voltage blocking capability, without increasing the lateral dimension along said top major surface, whereby to afford high density, high voltage bidirectional FET structure;
   wherein said notches extend downwardly into said drift region a substantial distance below said first and second gate electrode means to substantially diminish attraction of carriers by said gate electrode means from said drift region towards the edges of said notches, to further prevent unwanted inducement of conduction channels in said OFF state and afford higher OFF state voltage blocking capability;

wherein the portion of each of said first and second notches below said first and second gate electrode means comprises anodized single crystalline porous silicon oxidized to a substantially insulative condition.

6. The invention according to claim 1 wherein said channel regions extend horizontally along a top major surface between a respective said source region and said drift region, and said portions of said insulated gate means extend horizontally along said top major surface above respective said channel regions.

7. A bidirectional lateral power FET, comprising:
a substrate of semiconductor material of one conductivity type having a top major surface;
a pair of channel regions of the other conductivity type laterally spaced in said substrate;
a pair of source regions of said one conductivity type laterally spaced along said top major surface and each forming a junction with a respective one of said channel regions;
first and second spaced notches in said substrate extending downwardly from said top major surface between said source regions and said channel regions into a drift region in said substrate, such that the conductive current path is directed from one source region through one said channel region then into said drift region along the distal side of said first notch, then around the bottom of the notches, then along the distal side of the second notch and through the other channel region to said other source region, with the same path conducting current in the reverse direction from said other source region to said one source region;
a pair of main electrodes connected respectively to said source regions;
first insulated gate electrode means in said first notch and including a portion proximate said first channel region for attracting given polarity carriers to invert said first channel region to said one conductivity type in response to a given gate potential, and second insulated gate electrode means in said second notch and including a portion proximate said second channel region for attracting given polarity carriers to invert said second channel region to said one conductivity type in response to given gate potential, such that current may flow in either direction between said main electrodes, said FET having an OFF state in the absence of said gate potential, said second gate electrode means being between said first gate electrode means and the portion of said drift region along the distal edge of said second notch for shielding the latter from electric field gradients from said first gate electrode means, said first gate electrode means being between said second gate electrode means and the portion of said drift region along the distal edge of said first notch to shield the latter from electric field gradients from said second gate electrode means, whereby to prevent unwanted depletion and inducement of conduction channels in said drift region during OFF state and thus afford increased voltage blocking capability;

wherein said notches extend downwardly into said drift region a substantial distance below said gate electrode means to further substantially diminish attraction of carriers by said gate electrode means from said drift region toward the edges of said notches, to further prevent unwanted inducement of conduction channels during said OFF state of said FET structure and afford higher OFF state voltage blocking capability, and wherein said channel regions extend vertically along notch edges, said notches extend downwardly into said drift region to a depth substantially below said channel regions, and said gate electrode means extend downwardly to about the depth of said channel regions.

* * * * *